United States Patent
Schwartz et al.

(10) Patent No.: US 9,676,382 B2
(45) Date of Patent: Jun. 13, 2017

(54) SYSTEMS AND METHODS FOR HYBRID VEHICLES WITH A HIGH DEGREE OF HYBRIDIZATION

(71) Applicant: Palo Alto Research Center Incorporated, Palo Alto, CA (US)

(72) Inventors: David E. Schwartz, San Carlos, CA (US); Bhaskar Saha, Union City, CA (US); Simon Barber, San Francisco, CA (US); Sean Garner, Burlingame, CA (US); John Hanley, Emerald Hills, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 88 days.

(21) Appl. No.: 14/255,235

(22) Filed: Apr. 17, 2014

(65) Prior Publication Data

US 2015/0298689 A1    Oct. 22, 2015

(51) Int. Cl.
*B60W 20/00* (2016.01)
*B60W 50/04* (2006.01)
(Continued)

(52) U.S. Cl.
CPC ............ *B60W 20/20* (2013.01); *B60W 10/24* (2013.01); *B60W 20/12* (2016.01); *B60W 40/12* (2013.01);
(Continued)

(58) Field of Classification Search
None
See application file for complete search history.

(56) References Cited

U.S. PATENT DOCUMENTS

| | | | |
|---|---|---|---|
| 3,870,116 A | 3/1975 | Seliber | |
| 3,923,115 A | 12/1975 | Helling | |

(Continued)

FOREIGN PATENT DOCUMENTS

| | | |
|---|---|---|
| EP | 0890918 | 1/1999 |
| EP | 0903259 | 3/2003 |

(Continued)

OTHER PUBLICATIONS

Duoba, "Engine Design, Sizing and Operation in Hybrid Electric Vehicles", Presentation at University of Wisconsin-Madison, Jun. 8, 2011, 39 pages.

(Continued)

*Primary Examiner* — Rami Khatib
(74) *Attorney, Agent, or Firm* — Hollingsworth Davis, LLC

(57) ABSTRACT

Hybrid vehicle design circuitry quantifies values for utility/disutility variables of a hybrid vehicle design by evaluating a hybrid vehicle model over a collection of drive cycles/routes. The utility/disutility values include at least one of: total time or additional time beyond a reference time needed for the hybrid vehicle design to complete the drive cycles/routes, a fraction or number of the drive cycles/routes for which the hybrid vehicle design fails to achieve a target velocity, and amount of time or distance over which the hybrid vehicle design fails to achieve a target acceleration or the target velocity over the drive cycles/routes. The hybrid vehicle design circuitry calculates one or more specifications of a hybrid vehicle design based on the utility/disutility values.

16 Claims, 11 Drawing Sheets

(51) Int. Cl.
| | |
|---|---|
| *B60W 50/06* | (2006.01) |
| *B60W 50/08* | (2012.01) |
| *B60W 40/12* | (2012.01) |
| *B60W 20/20* | (2016.01) |
| *B60W 10/24* | (2006.01) |
| *B60W 20/12* | (2016.01) |
| *B60W 30/188* | (2012.01) |
| *G06F 17/50* | (2006.01) |
| *B60W 50/00* | (2006.01) |

(52) U.S. Cl.
CPC ......... *B60W 50/085* (2013.01); *B60W 30/188* (2013.01); *B60W 2050/0018* (2013.01); *G06F 17/5009* (2013.01); *G06F 17/5095* (2013.01); *Y10S 903/904* (2013.01)

(56) References Cited

U.S. PATENT DOCUMENTS

| | | | |
|---|---|---|---|
| 4,309,620 A | 1/1982 | Bock | |
| 4,423,794 A | 1/1984 | Beck | |
| 4,625,823 A | 12/1986 | Frank | |
| 4,757,686 A | 7/1988 | Kawamura et al. | |
| 5,076,059 A | 12/1991 | Okada | |
| 5,406,797 A | 4/1995 | Kawamura | |
| 5,427,194 A | 6/1995 | Miller | |
| 5,636,509 A | 6/1997 | Abell | |
| 5,713,426 A | 2/1998 | Okamura | |
| 5,931,249 A | 8/1999 | Ellis et al. | |
| 6,018,694 A | 1/2000 | Egami et al. | |
| 6,186,255 B1 | 2/2001 | Shimasaki et al. | |
| 6,205,379 B1 | 3/2001 | Morisawa et al. | |
| 6,242,873 B1 | 6/2001 | Drozdz et al. | |
| 6,330,498 B2 | 12/2001 | Tamagawa et al. | |
| 6,443,125 B1 | 9/2002 | Mendler | |
| 6,469,402 B2 | 10/2002 | Morimoto et al. | |
| 6,554,088 B2 | 4/2003 | Severinsky et al. | |
| 6,659,212 B2 | 12/2003 | Geisse et al. | |
| 6,684,863 B2 | 2/2004 | Dixon et al. | |
| 6,823,853 B2 | 11/2004 | Clarkson et al. | |
| 6,931,850 B2 | 8/2005 | Frank et al. | |
| 6,956,298 B2 | 10/2005 | Kitajima et al. | |
| 6,962,223 B2 | 11/2005 | Berbari | |
| 6,995,529 B2 | 2/2006 | Sibley | |
| 7,076,954 B1 | 7/2006 | Sopko, Jr. et al. | |
| 7,178,617 B2 | 2/2007 | Morisawa et al. | |
| 7,240,748 B2 | 7/2007 | Kira et al. | |
| 7,597,164 B2 | 10/2009 | Severinsky et al. | |
| 7,654,355 B1 | 2/2010 | Williams | |
| 7,691,027 B2 | 4/2010 | Soliman et al. | |
| 7,931,107 B2 | 4/2011 | Jones, Jr. | |
| 8,028,778 B2 | 10/2011 | Luo et al. | |
| 8,043,194 B2 | 10/2011 | Soliman et al. | |
| 8,050,856 B2 | 11/2011 | Duty et al. | |
| 8,079,349 B2 | 12/2011 | Rauner et al. | |
| 8,142,329 B2 | 3/2012 | Ortmann | |
| 8,176,901 B2 | 5/2012 | Ai et al. | |
| 8,250,864 B2 | 8/2012 | Pott et al. | |
| 8,265,813 B2 | 9/2012 | Heap | |
| 8,359,145 B2 | 1/2013 | Bowman et al. | |
| 8,386,091 B2 | 2/2013 | Kristinsson et al. | |
| 8,615,336 B1 | 12/2013 | Vos | |
| 8,758,193 B2 | 6/2014 | Ichikawa et al. | |
| 8,781,664 B2 | 7/2014 | Sujan et al. | |
| 8,852,051 B2 | 10/2014 | Sujan et al. | |
| 8,959,912 B2 | 2/2015 | Hoess et al. | |
| 8,972,161 B1 | 3/2015 | Koebler et al. | |
| 9,048,765 B2 | 6/2015 | Dobbs | |
| 9,102,325 B2 | 8/2015 | Jung | |
| 9,108,528 B2 | 8/2015 | Yang et al. | |
| 2002/0065165 A1 | 5/2002 | Lasson et al. | |
| 2007/0012493 A1 | 1/2007 | Jones | |
| 2007/0144175 A1 | 6/2007 | Sopko, Jr. et al. | |
| 2008/0022686 A1 | 1/2008 | Amdall et al. | |
| 2008/0219866 A1 | 9/2008 | Kwong et al. | |
| 2009/0211384 A1 | 8/2009 | Lass | |
| 2010/0010732 A1 | 1/2010 | Hartman | |
| 2010/0292047 A1 | 11/2010 | Saito | |
| 2011/0100735 A1 | 5/2011 | Flett | |
| 2011/0295433 A1 | 12/2011 | Evans | |
| 2012/0109515 A1 | 5/2012 | Uyeki et al. | |
| 2012/0130625 A1 | 5/2012 | Srivastava | |
| 2012/0197472 A1 | 8/2012 | He et al. | |
| 2012/0208672 A1 | 8/2012 | Sujan et al. | |
| 2012/0271544 A1 | 10/2012 | Hein et al. | |
| 2012/0290149 A1 | 11/2012 | Kristinsson et al. | |
| 2013/0024179 A1 | 1/2013 | Mazzaro et al. | |
| 2013/0042617 A1 | 2/2013 | Atkins et al. | |
| 2013/0046526 A1* | 2/2013 | Yucel ................. G01C 21/3469 703/8 |
| 2013/0079966 A1 | 3/2013 | Terakawa et al. | |
| 2013/0269340 A1 | 10/2013 | Schumacher et al. | |
| 2013/0296107 A1 | 11/2013 | Nedorezov et al. | |
| 2014/0205426 A1 | 7/2014 | Costall | |
| 2014/0346865 A1 | 11/2014 | Akashi et al. | |
| 2015/0019132 A1 | 1/2015 | Gusikhin et al. | |
| 2015/0224864 A1 | 8/2015 | Schwartz et al. | |
| 2015/0258986 A1 | 9/2015 | Hayakawa | |
| 2015/0298684 A1 | 10/2015 | Schwartz et al. | |

FOREIGN PATENT DOCUMENTS

| | | |
|---|---|---|
| EP | 0933246 | 6/2004 |
| EP | 0916547 | 12/2004 |
| EP | 1442909 | 9/2006 |
| EP | 1869609 | 12/2007 |
| EP | 2251805 | 11/2010 |
| EP | 2369511 | 9/2011 |
| EP | 2055606 | 2/2013 |
| EP | 2055584 | 5/2013 |
| EP | 2067679 | 8/2013 |
| WO | WO2007067842 | 6/2007 |
| WO | WO2008112843 | 9/2008 |
| WO | WO2008125860 | 10/2008 |
| WO | WO2010081836 | 7/2010 |
| WO | WO2011066468 | 6/2011 |

OTHER PUBLICATIONS

"Flywheel Hybrid Vehicle Delivers Up to 22.4% Fuel Economy Improvement", Prodrive, Sep. 12, 2011, 2 pages.

Fu et al., "Real-time Energy Management and Sensitivity Study for Hybrid Electric Vehicles", 2011 American Control Conference, San Francisco, Jun. 29-Jul. 1, 2011, pp. 2113-2118.

Geller, "Increased Understanding of Hybrid Vehicle Design Through Modeling, Simulation, and Optimization", 2010, 98 pages.

Karbowski et al., "PHEV Control Strategy Assessment Through Optimization", DOE Merit Review, Feb. 28, 2008, 9 pages.

Karbowski et al., "PHEV Control Strategy", 2009 DOE Hydrogen Program and Vehicle Technologies Annual Merit Review, May 19, 2009, 18 pages.

Kim, "Instantaneous Optimal Control for Hybrid Electrical Vehicles", DOE Update, Apr. 18, 2011, 21 pages.

Kim et al., Comparison Between Rule-Based and Instantaneous Optimization for a Single-Mode, Power-Split HEV, 2011, 10 pages.

Mahapatra et al., "Model-Based Design for Hybrid Electric Vehicle Systems", The Math Works, Inc., 2008, 10 pages.

Moawad et al., "Impact of Real World Drive Cycles on PHEV Fuel Efficiency and Cost for Different Powertrain and Battery Characteristics", EVS24 International Batter, Hybrid and Fuel Cell Electric Vehicle Symposium, May 13-16, 2009, pp. 1-10.

Pagerit et al., "Global Optimization to Real Time Control of HEV Power Flow: Example of a Fuel Cell Hybrid Vehicle", printed from the internet on Sep. 3, 2013, 13 pages.

Serrao et al., "Open Issues in Supervisory Control of Hybrid Electric Vehicles: A Unified Approach Using Optimal Control Methods", Oil & Gas Science and Technology, vol. 68, 2013, pp. 23-33.

Stence, "Hybrid Vehicle Control Systems", Portabledesign.com, May 2006, pp. 28-30.

(56) References Cited

OTHER PUBLICATIONS

Synopsys, "Hybrid and Electric Vehicle Design", printed from internet on Sep. 13, 2013, 3 pages.
van Keulen et al., "Energy Management in Hybrid Electric Vehicles: Benefit of Prediction", Proceedings of the 6$^{th}$ IFAC Symposium on Advances in Automotive Control, Jul. 12-14, 2010, Munich, Germany, pp. 1-6.
van Kuelen et al., "Predictive Cruise Control in Hybrid Electric Vehicles", World Electric Vehicle Journal, vol. 3, May 2009, pp. 1-11.
Zhang et al., "Role of Terrain Preview in Energy Management of Hybrid Electric Vehicles", IEEE Transactions on Vehicular Technology, vol. 59, No. 3, Mar. 2010, pp. 1139-1147.
File History for U.S. Appl. No. 14/255,091.
File History for U.S. Appl. No. 14/178,572.

\* cited by examiner

SYSTEMS AND METHODS FOR HYBRID VEHICLES WITH A HIGH DEGREE OF HYBRIDIZATION

TECHNICAL FIELD

This disclosure relates to hybrid vehicles and hybrid vehicle design systems and methods.

SUMMARY

Some embodiments involve a system for designing hybrid vehicles. The system includes input circuitry configured to receive input values for one or more hybrid vehicle design variables. Hybrid vehicle design circuitry quantifies one or more values for one more utility/disutility variables of a hybrid vehicle design based on the input values by evaluating a hybrid vehicle model over a collection of at least one of drive cycles and routes (drive cycles/routes). The utility/disutility values can include at least one of: total time or additional time beyond a reference time needed for the hybrid vehicle design to complete the drive cycles/routes, a fraction or number of the drive cycles/routes for which the hybrid vehicle design fails to achieve a target velocity, and an amount of time or distance over which the hybrid vehicle design fails to achieve a target acceleration or the target velocity over the drive cycles/routes. The hybrid vehicle design circuitry calculates one or more specifications of the hybrid vehicle design based on the utility/disutility values.

Some embodiments are directed to a system for designing a hybrid vehicle for a particular geographic region. The system includes input circuitry configured to receive input values for one or more hybrid vehicle design variables. Hybrid vehicle design circuitry quantifies values for utility/disutility variables of a hybrid vehicle design based on the input values by evaluating a hybrid vehicle model over a collection of at least one of drive cycles and routes (drive cycles/routes). The utility/disutility values can include at least one of: total time or additional time beyond a reference time needed for the hybrid vehicle design to complete the drive cycles/routes, a fraction or number of the drive cycles/routes for which the hybrid vehicle design fails to achieve a target velocity, and an amount of time or distance over which the hybrid vehicle design fails to achieve a target acceleration or the target velocity over the drive cycles/routes. The hybrid vehicle design circuitry calculates specifications of a hybrid vehicle design based on the utility/disutility values. The specifications provide performance within a specified range for a particular geographic region.

In some embodiments, a method of designing a hybrid vehicle involves receiving input values for one or more hybrid vehicle design variables. One or more values for one more utility/disutility variables of a hybrid vehicle design are quantified based on the input values. Quantifying the utility/disutility variables includes evaluating a hybrid vehicle model over a collection of at least one of drive cycles and routes (drive cycles/routes). The utility/disutility values including at least one of: total time or additional time beyond a reference time needed for the hybrid vehicle design to complete the drive cycles/routes, a fraction or number of the drive cycles/routes for which the hybrid vehicle design fails to achieve a target velocity, and amount of time or distance over which the hybrid vehicle design fails to achieve a target acceleration or the target velocity over the drive cycles/routes. One or more specifications of a hybrid vehicle design are calculated based on the utility/disutility values.

According to some embodiments, a method includes receiving first input values for one or more hybrid vehicle design variables. The first input values include a first set of driver-specific performance preferences. First specifications of a reconfigurable hybrid vehicle design car calculated by a processor based on the first set of driver performance preferences. The hybrid vehicle is configured based on the first specifications. After a second set of input values including a second set of driver-specific performance preferences are received, a processor is used to calculate second specifications of a reconfigurable hybrid vehicle design based on the second set of driver performance preferences. The hybrid vehicle is reconfigured based on the second specifications.

Some embodiments involve a hybrid vehicle that includes at least one reconfigurable component. The hybrid vehicle includes a fuel consuming engine and an energy storage device disposed within the hybrid vehicle. The fuel consuming engine and the energy storage device supply power to drive the hybrid vehicle. A controller automatically controls power flow from the engine and from the energy storage device so as to provide power to drive the hybrid vehicle. Communication circuitry receives a signal that includes a command to reconfigure and reconfiguration values for the hybrid vehicle. A reconfiguration controller reconfigures the reconfigurable component in response to the signal.

Some embodiments involve a hybrid vehicle with a reconfigurable component, e.g., a reconfigurable flywheel. The hybrid vehicle includes a fuel consuming engine that supplies power to drive the hybrid vehicle. The flywheel is disposed within the hybrid vehicle and stores kinetic energy used to supply power to drive the hybrid vehicle. The flywheel includes one or more masses at locations that are positionally adjustable. The hybrid vehicle includes a controller that automatically controls power flow from the engine and from the flywheel so as to provide power to drive the hybrid vehicle.

DETAILED DESCRIPTION

Figure 1:
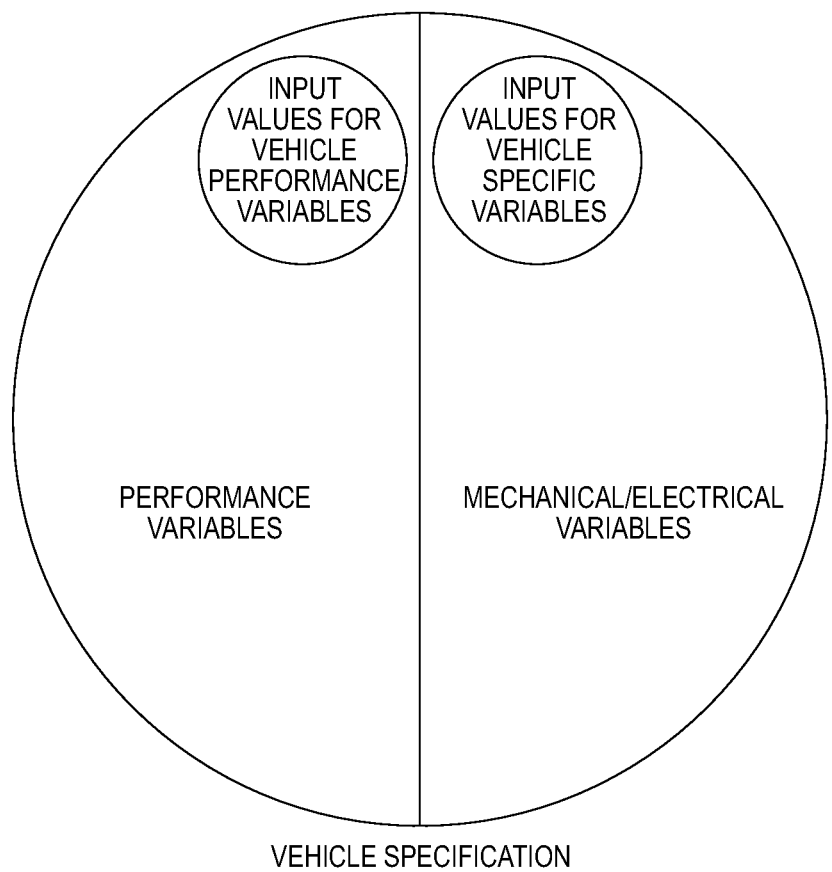
FIG. 1 illustrates design specifications for hybrid vehicles one or more of which can be determined using the approaches described herein.

In the following description, reference is made to the accompanying set of drawings that form a part of the description hereof and in which are shown by way of illustration several specific embodiments. It is to be understood that other embodiments are contemplated and may be made without departing from the scope of the present disclosure. The following detailed description, therefore, is not to be taken in a limiting sense.

This disclosure relates to hybrid vehicles, and in particular to hybrid vehicles with a "high Degree of Hybridization" (hereinafter "high DoH vehicles"). A high DoH vehicle includes a fuel consuming engine and at least one other means to power the vehicle connected to an energy storage device, such that the engine by itself is incapable of delivering the maximum power demanded by the vehicle under typical usage, wherein typical usage is the collection of route profiles and driver behaviors for which the vehicle is expected or designed to be used. By limiting the power output of the fuel consuming engine, the engine may be operated to better provide one or more driver-desired (e.g., user-specified) variables such as fuel consumption and emissions.

In some embodiments, the fuel consuming engine may provide somewhat more than the mean power, but not necessarily the maximum power, required for operating the vehicle. In certain embodiments, the fuel consuming engine may not be capable of providing the peak power demand of the vehicle. In some embodiments, the fuel consuming engine may provide at least the mean power, but less than the peak power, required for operating the vehicle. In certain embodiments, the fuel consuming engine may be capable of providing sufficient power to sustain a reasonable velocity on a relatively flat road, to climb a hill at a low velocity, and to accelerate at a relatively slow rate.

Because the fuel consuming engine in the high DoH vehicle may be under-powered relative to the vehicle's operational demands, embodiments of the high DoH vehicle disclosed herein include one or more energy storage elements. In certain embodiments, the one or more energy storage elements may include a relatively high-powered electrical or mechanical component, e.g., electric motor coupled to a battery and/or gears and clutches coupled to a flywheel, configured to provide the power required for enabling faster acceleration and climbing a hill at a higher velocity. The power required for operating the electrical motor may be provided by the one or more energy storage elements such as a mechanical storage element, e.g., a flywheel, or an electrical energy storage element, e.g., an ultra-capacitor(s) (also called a super-capacitor(s)). In some embodiments, electrochemical battery pack(s) may be used in place of the flywheel or ultra-capacitor.

Flywheels and ultra-capacitors have relatively higher power densities than batteries so that the same amount of power can be obtained with smaller and/or less expensive energy storage elements than batteries. For example, to achieve the same power as a flywheel, the battery pack may need to be relatively larger, heavier, and more expensive. However, while fly-wheels and ultra-capacitors have higher power densities, they have lower energy densities when compared to a battery, for example. This means they can provide sufficient power for enabling the vehicle to accelerate effectively, increase velocity, climb a hill, to maintain a high velocity, etc., only for a limited duration compared to the duration provided by a battery, for example. For example, at full power, ultra-capacitors will typically discharge in seconds and flywheels will typically discharge in tens of seconds or minutes. If a driver intends to accelerate when the energy storage element is depleted, the available power will be limited to the power of the fuel consuming engine, which may be insufficient because it is under-powered as described elsewhere. Typically, a smaller fuel consuming engine and energy storage element may lead to a lighter, less expensive vehicle at the cost of reduced power availability.

In general, the disclosure pertains to embodiments of a system comprising a design tool having an optimization routine for investigating tradeoffs among the fuel consuming engine and the energy storage elements, vehicle performance and drivability, and vehicle operation including fuel consumption and/or emissions. As illustrated in FIG. 1, the output of the vehicle design is a vehicle specification which is a set of values for the vehicle specification variables. For example, the specifications may include properties of one or more of: a fuel-consuming engine, an energy storage device, a flywheel, a battery, an ultracapacitor, a transmission (such as a transmission type), and a power train, e.g., series or parallel configuration.

In FIG. 1, the vehicle specification variables are for convenience grouped into performance variables and mechanical/electrical variables. Performance variables may include, but are not limited to, variables such as acceleration, fuel consumption, emissions, and maximum achievable velocity, driver experience, etc. Mechanical/electrical variables may include, but are not limited to, variables such as engine size, mechanical/electrical/electromechanical energy storage capacity, drag, mass, rolling resistance, power train configuration, etc. The vehicle design may start with specified values for one or more input performance variables and/or one or more input mechanical/electrical variables and calculate values for the remaining vehicle specification variables. In some embodiments, addition to or in combination with other performance variables, the design may be configured to provide a specified amount of uniformity of the driver experience. For example, the driver may expect the vehicle to behave in the same manner every time the accelerator pedal is depressed in a similar driving situation. Using historical data or a set of constraints, the vehicle design may take into consideration driver experience which can involve not delivering the full available power in favor of delivering a predictable traction power to the vehicle. Designing for a specified level of driver experience is particularly useful when the vehicle design includes an advanced control system as disclosed in Applicant's co-owned U.S. patent application Ser. No. 14/255,091, which is incorporated herein by reference.

Figure 2:
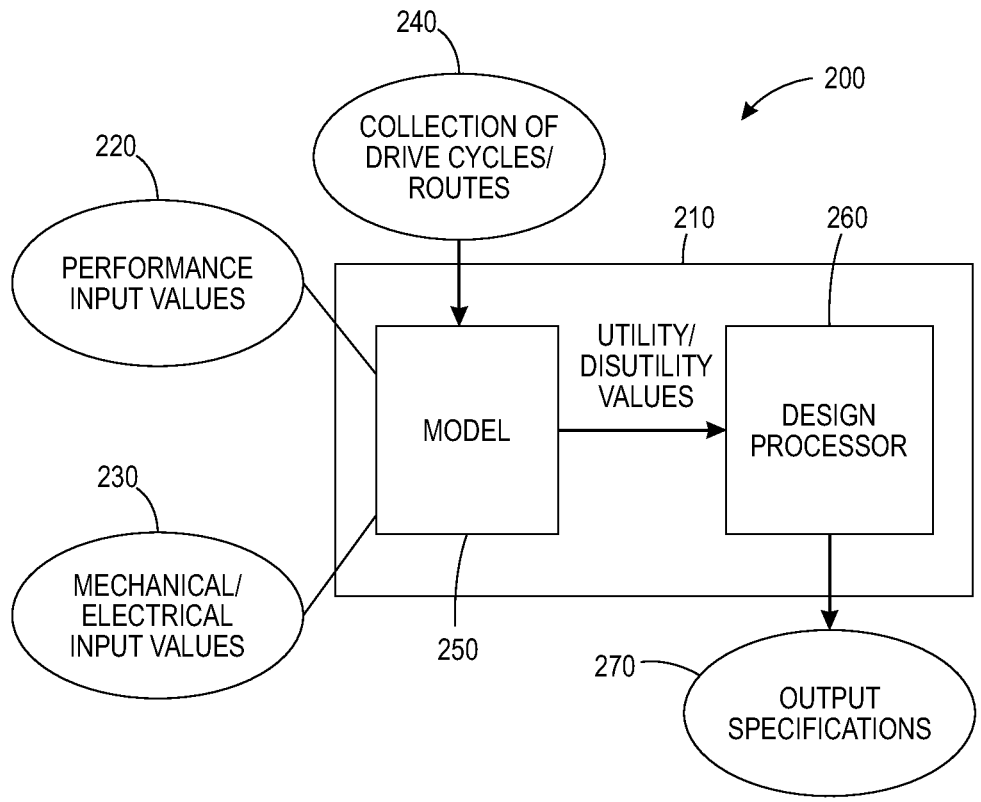
FIG. 2 is a block diagram representation a hybrid vehicle design system in accordance with some embodiments.
Figure 3:
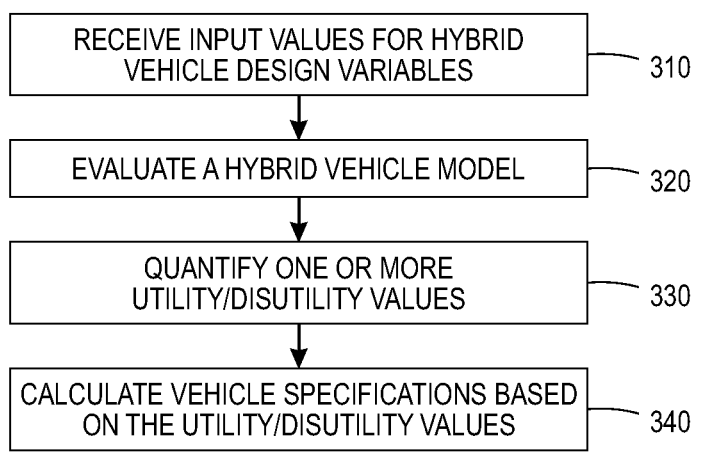
FIG. 3 is a flow diagram of a process for calculating vehicle specifications in accordance with some embodiments.

FIG. 2 illustrates a hybrid vehicle design system 200 in accordance with some embodiments. FIG. 3 is a flow diagram of a method designing a hybrid vehicle using the system 200. The hybrid vehicle design circuitry 210 may be configured to receive 310 input values for one or more hybrid vehicle design variables. For example, the design circuitry may receive performance input values 220 and mechanical/electrical input values 230. The design circuitry 210 evaluates 320 a model that includes the input values wherein the model 250 is operated over a test scenario that includes a collection 240 of one or more drive cycles, e.g., a set of data points representing the speed of the vehicle versus time, and/or one or more routes which may include actual routes a driver may take or has taken in the past. The routes may include topographical and/or traffic information, for example. Evaluating the model 250 over the drive cycles/routes quantifies 330 one or more utility and disutility variables. The design circuitry 210 includes a design processor 260 configured to calculate 340 vehicle specifications 270 based at least in part on the utility/disutility values.

The utility and disutility variables include at least one of
total time or additional time beyond a reference time needed for the hybrid vehicle design to complete the drive cycles/routes,
a fraction or number of the drive cycles/routes for which the hybrid vehicle design fails to achieve a target velocity, and
amount of time or distance over which the hybrid vehicle design fails to achieve a target acceleration or the target velocity over the drive cycles/routes.

Additionally or alternatively, the utility/disutility variables can include one or more of:
Engine consumption and output such as
Fuel consumption
Energy consumption
Emission output
Instantaneous performance:
Time to accelerate from a first specified velocity to a second specified velocity, e.g. 0 to 60 miles per hour (mph)
Achievable velocity on a level road
Trip-based performance:
The portion of a given set of roads (e.g. in a specific city or region) that can be traversed at given velocities (e.g., the speed limit)
Portion of a set of drive cycles that can be completed based on:
Standard dynamometer drive schedules and/or variations thereof, including stochastic variations maintaining the total or average power, the power spectral density, etc.
A set of routes in a category (e.g. city driving, commuting)
Additional time required to complete a drive cycle, or fastest time to complete the drive cycle (depending on whether it can be completed as specified)

Figure 4:
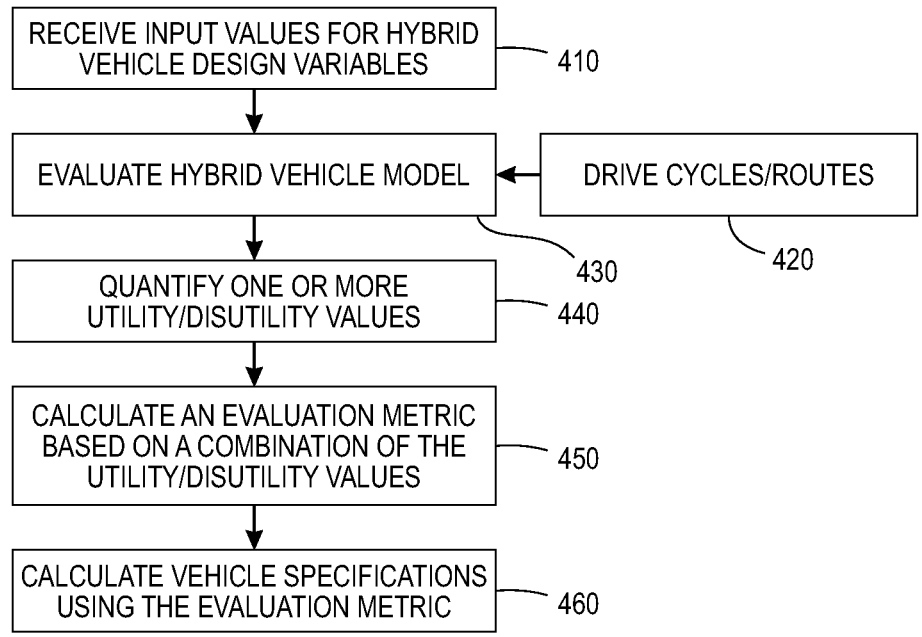
FIG. 4 is a flow diagram of a process for calculating vehicle specifications using an evaluation metric comprising a combination of utility/disutility values.

In some embodiments, as illustrated by the flow diagram of FIG. 4, the design circuitry is configured to calculate an evaluation metric based on one or a combination of the utility/disutility values. The design circuitry receives 410 input values for some of the hybrid vehicle design variables. The hybrid vehicle model is evaluated 430 over a set of drive cycles/routes 420 to quantify 440 one or more utility/disutility values. The drive cycles/routes used to quantify the one or more utility/disutility values may be one or more standard routes and/or one or more federally mandated routes. In some embodiments, the utility/disutility metrics can be used to determine the drive cycles/routes chosen. For example: if acceleration from 0 to 60 mph is the metric then an appropriate full-throttle drive cycle would be chosen. The federally mandated highway drive cycle or the Urban Dynamometer Driving Schedule (UDDS) could be chosen to if merging performance (30-60 mph) needs to be prioritized. Emissions could be calculated over the worst-case city profile or the New York City Cycle (NYCC).

In some embodiments, the design circuitry is configured to calculate 450 an overall evaluation metric based on a combination of utility/disutility values. The evaluation metric serves as an overall figure of merit that may be used to compare different designs. The evaluation metric could combine the scores over the different utility/disutility variables. In some implementations, different weighting of the utility/disutility variables could also figure into the evaluation metric. For example, there might be a weighting of time to destination and fuel economy; there may be a range of configurations available that trade off these two variables. Based on the weighting, an intermediate design can be chosen. The vehicle specifications are calculated 460 using the evaluation metric. For example, to evaluate some utility and disutility variables, e.g., those indicating instantaneous performance, the model is evaluated over one or m under a scenario specific to the metric. In some embodiments, the hybrid vehicle design is evaluated by comparing at least one of the utility/disutility values to a benchmark associated with a standard vehicle model. A relative metric can be developed from the comparison.

In some embodiments, the design circuitry receives input values for the hybrid vehicle design variables, which could be either values for performance variables, e.g., fuel consumption under certain conditions, acceleration under certain conditions, etc., or values for mechanical/electrical variables, such as mass, drag coefficients, size of the fuel consuming engine, and maximum power and energy of the energy storage element, or both input values for some of the performance variables and some of the mechanical/electrical variables. The design circuitry uses the input values as part of the model. In certain embodiments, the vehicle model includes an engine map that relates the engine operating point to brake-specific fuel consumption (BSFC), an instantaneous measure of how much fuel is being used by the engine, or emissions, such as how much carbon dioxide is being produced in a given time interval, so that these can be calculated. BSFC may be calculated as the rate of fuel consumption divided by the power produced and may also be considered power-specific fuel consumption. The BSFC provides a metric for comparing the fuel efficiency of different engines.

Figure 5:
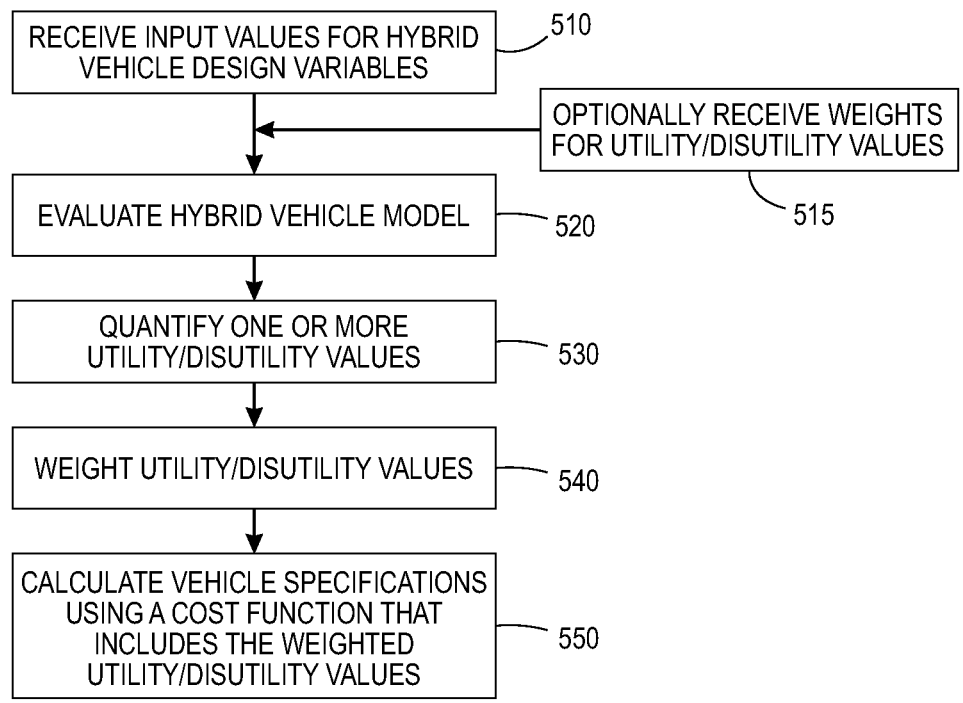
FIG. 5 is a flow diagram of a process of calculating vehicle specifications using a cost function.

As shown in the flow diagram of FIG. 5, in some embodiments, the vehicle design can be performed, e.g., optimized, using a cost function. As previously discussed, input values for some hybrid vehicle variables may be received 510, e.g., either accessed from a database or entered by a user, and used as part of a model. Optionally, weights for utility/disutility values can be received 520, e.g., accessed from memory or entered by a user. The model is evaluated 520 over a test scenario that includes drive cycles and/or routes to quantify 530 one or more utility/disutility variables. Specifications for the hybrid vehicle are calculated 550, e.g., optimized, using a cost function. The cost function is the equation or formula used to derive the FOM based on the weighted utility/disutility values. For example, a cost function including weighted utility/disutility values may have the form:

$$FOM = \frac{\sum a_i U_i(x) - \sum b_j D_j(x)}{N},$$

where a and b are weights, $U_i$ are the utility functions, $D_i$ are disutility function, N is the total number of utility and disutility functions, and x is the vector of vehicle performance values.

Figure 6:
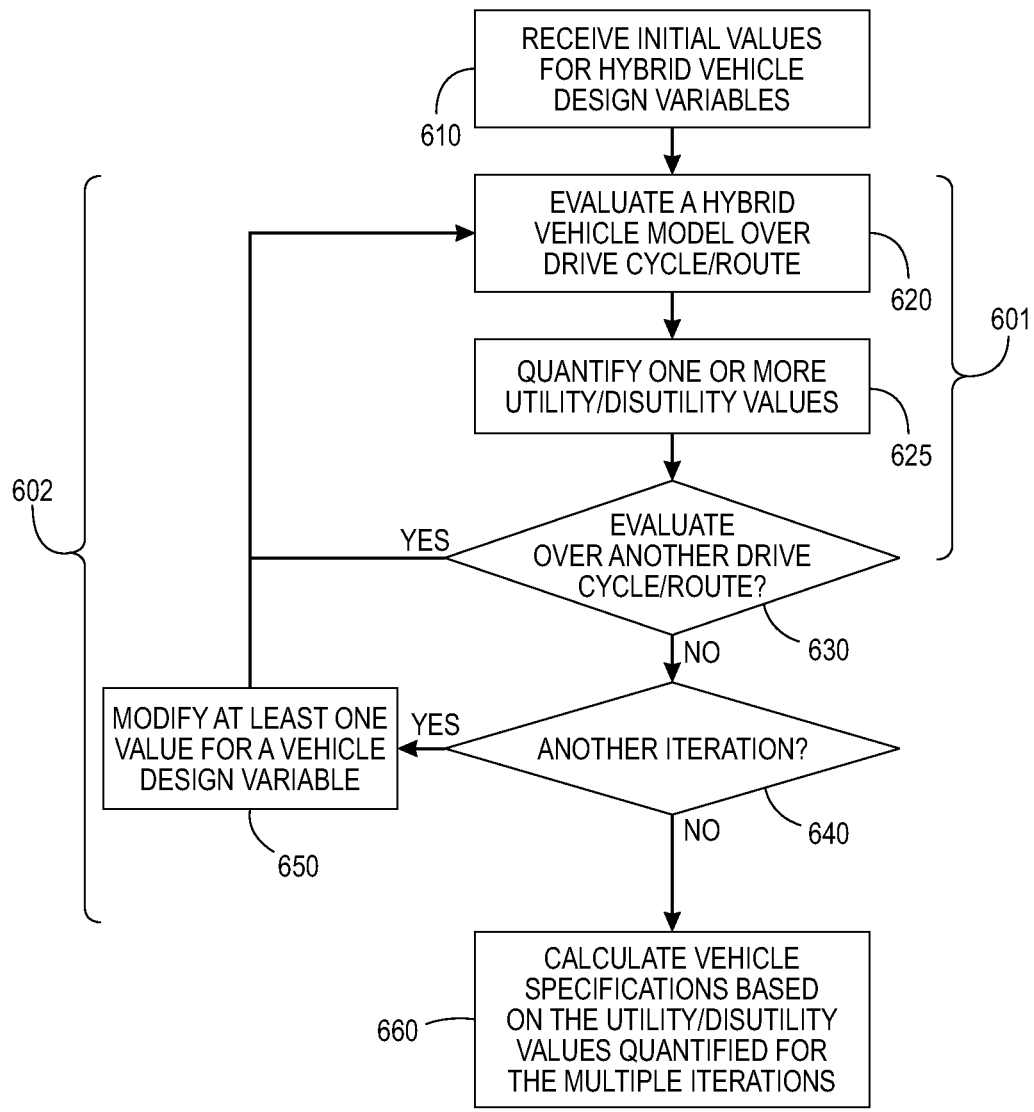
FIG. 6 is a flow diagram of a multi-loop iterative process for calculating vehicle specifications.

Some embodiments involve multiple iteration loops, e.g., inner and outer iteration loops, wherein values for some hybrid vehicle variables are iteratively varied in an outer loop iteration and the model is re-evaluated over a test scenario that includes a collection of drive cycles/routes in an inner loop iteration. FIG. 6 illustrates an inner loop 601 that evaluates a vehicle model over the collection of drive cycles/routes and an outer loop 602 wherein the values for some hybrid vehicle variables, e.g. engine size, engine map, energy storage capacity, are iteratively varied. Initial values for the hybrid vehicle design variables are received 610 and used to in the model. In the inner loop 601 the design circuitry iteratively evaluates 620 the model over 630 a number drive cycle/routes to quantify 625 one or more utility/disutility values. In each iteration of the outer loop 602, the design circuitry evaluates the model of the inner loop, modifying 650 at least one value of a hybrid vehicle design variable before 640 each outer loop iteration. The vehicle specifications are calculated 660 based on the utility/disutility values quantified over the multiple iterations of the one or more vehicle design variables that are varied.

Figure 7:
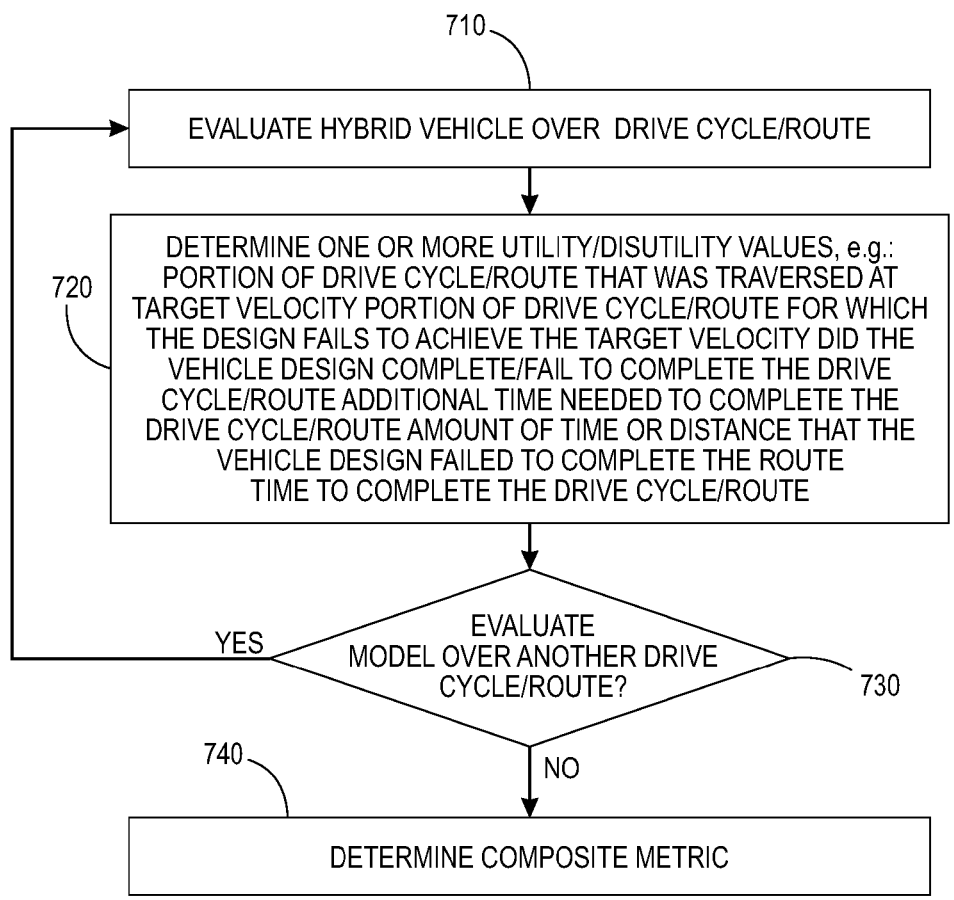
FIG. 7 is a flow diagram illustrating a process for determining a composite metric.

FIG. 7 illustrates in more detail an example of the inner loop 601 described in FIG. 6. The inner loop 601 evaluates 710 the model of the hybrid vehicle over each of a collection of drive cycles/routes of a test scenario. For each drive cycle/route 730, the values of one of more of the utility/disutility variables are determined 710. For example, determining the one or more utility/disutility values may involve determining one or more of: 1) portion of the drive cycle or route that was traversed at a target velocity, which may vary over the route, 2) portion of the drive cycle or route for which the vehicle design fails to achieve the target velocity, 3) did the vehicle design complete or fail to complete the drive cycle or route, 4) additional time needed to complete the drive cycle or route, amount of time (or distance) that the vehicle design failed to complete the route, and 5) time to complete the drive cycle or route. After the model of the hybrid vehicle design has been evaluated over all the drive cycles/routes of the collection, the design circuitry may determine 740 a composite metric based on all utility/disutility values determined during the iterative analysis.

Figure 8:
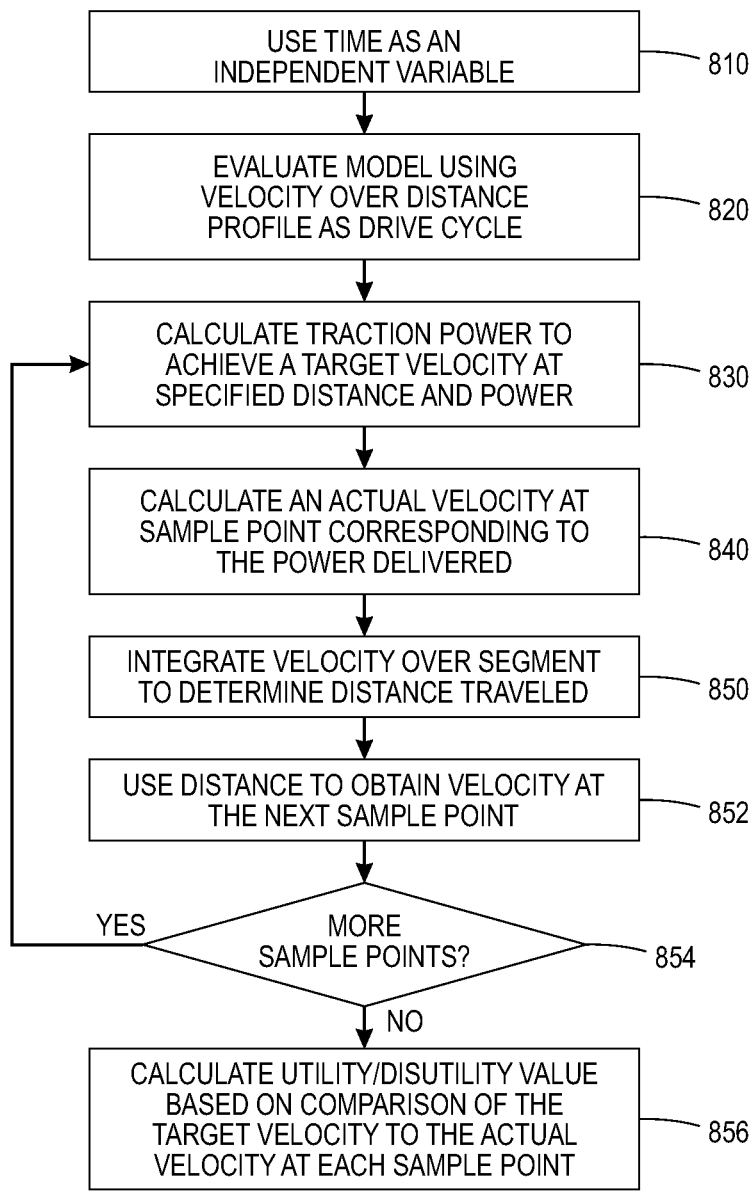
FIG. 8 is a flow diagram illustrating a process for evaluating a vehicle module using velocity over distance profile as a drive cycle.

FIG. 8 is a flow diagram that illustrates in more detail the process of quantifying a utility/disutility value based on actual velocity of the hybrid vehicle design over a drive cycle in accordance with some embodiments. Time is used 810 as an independent variable and the model is evaluated 820 over a drive cycle comprising a velocity over distance profile. The traction power to achieve a target velocity is calculated 830 at a specified distance and power. An actual velocity is calculated 840 that corresponds to the power delivered. After the actual velocity is computed at one sample point, the actual velocity over the last segment (i.e., between the last two sample points) can be integrated 850 to determine distance. The distance is then used to obtain 852 the velocity at the next sample point from the profile. The process continues 854 for each sample point of the drive cycle.

In this example, the utility/disutility value is a measure of how much time or distance the vehicle failed to achieve the target velocity and the utility/disutility value is be calculated 854 based on a comparison of the actual and target velocities. In general, the way the utility/disutility value is quantified depends on the particular utility/disutility variable being quantified.

In some implementations, calculating the utility/disutility value involves integrating the actual velocity over all segments for which the actual velocity is less than the target velocity to obtain the total route distance for which the target wasn't achieved. Additionally or alternatively, the reciprocal of the actual velocity may be integrated over all segments for which the actual velocity is less than the target velocity to obtain the total extra time required for the drive cycle.

Figure 9:
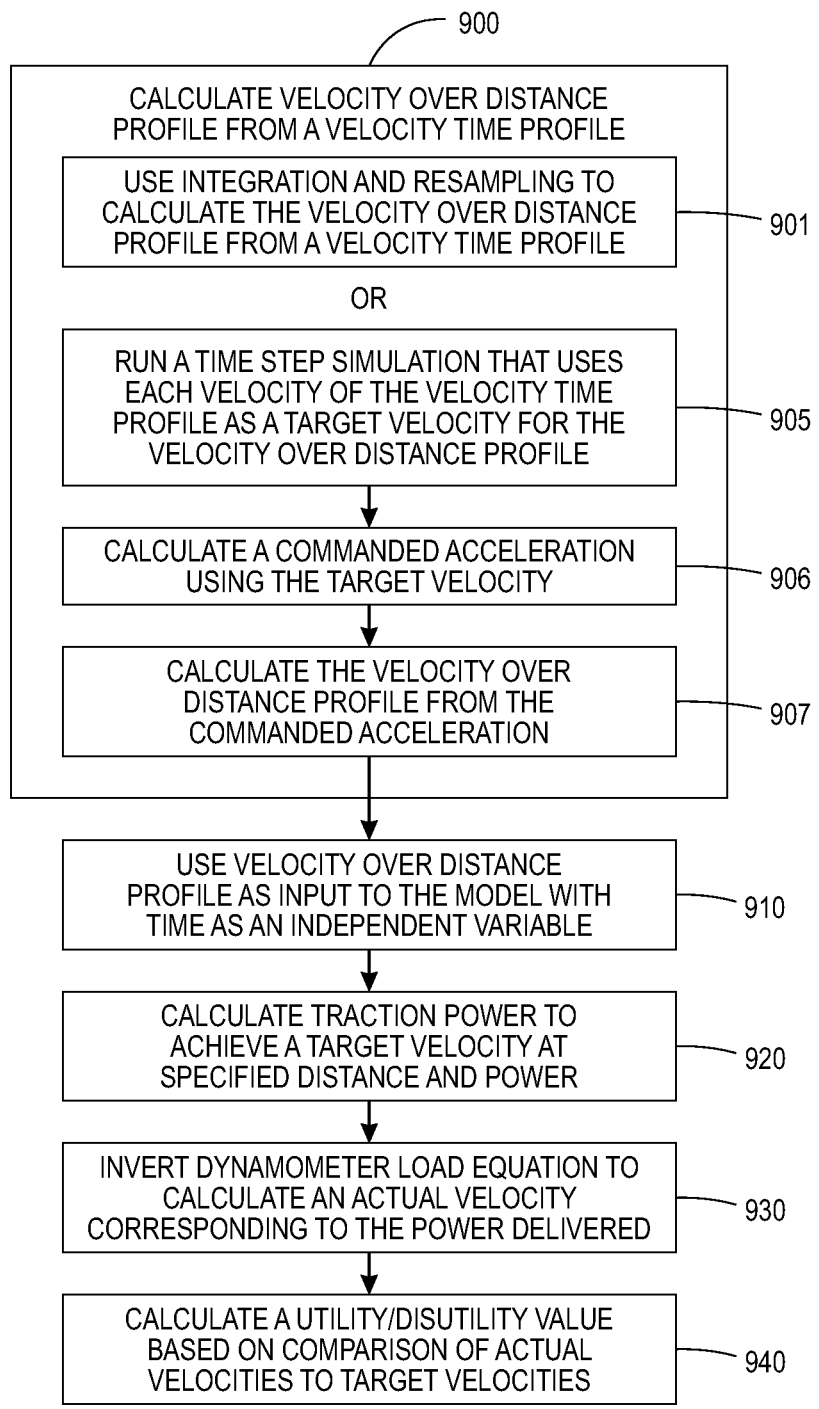
FIG. 9 is a flow diagram that shows a process for calculating a utility/disutility value based on an actual velocity indicated by the model.

FIG. 9 is a flow diagram that illustrates in more detail the process of quantifying a utility/disutility value including calculating a velocity over distance profile from a velocity time profile in accordance with some embodiments. The velocity over distance profile can be calculated 900 from a velocity time profile by several methods. Some approaches 901 involve using integration and resampling to calculate the velocity over distance profile from the velocity time profile. According to this approach, the distance is calculated by integrating the velocity with respect to time. In effect, this is summing the velocities and multiplying by the original sampling time interval. The distance profile can now be resampled at a shorter time interval, for example by linearly interpolating between the original sample points.

Alternatively or additionally, some approaches involve running 905 a time step simulation that uses each velocity of the velocity over time profile as a target velocity for the velocity for the velocity over distance profile. A commanded acceleration is calculated 906 using the target velocity. The velocity used for the velocity over distance profile is calculated 907 from the commanded acceleration. As an example of this approach, assume a portion of the velocity over time profile is given by Table 1 below. The commanded acceleration between any two consecutive times can be calculated by dividing the difference in the consecutive velocities by the time interval: the acceleration from time 101 to time 102 is $(20-10)/(102-101)=10$ m/s$^2$. Similarly, the acceleration from time 102 to time 103 is 0 m/s$^2$ and the acceleration from time 103 to time 104 is $-10$ m/s$^2$. If the distance at time 101 is 1000 m, the velocity at distance 1001 no can be computed by with the following formulas. The time t that distance d would be expected, to be achieved is given by the formula $$t = t(n) + t = \sqrt{\frac{2}{a(n)} * (d - d(n))},$$

where t(n), a(n), and d(n) indicate time, acceleration and distance at sample preferably the sample of the last known distance before the target distance. The target velocity at distance d is given by $$v = \frac{d - d(n)}{t - t(n)}.$$

In this example, $$t = \sqrt{\frac{2}{10} * (1001 - 1000)} = 101.4 \ s \text{ and}$$

$$v = \frac{1001 - 1000}{101.4 - 101} = 2.5 \text{ m/s}.$$

Thus the point (d,v)=(1001,2.5) could be entered in the velocity over distance profile.

TABLE 1

| Time (s) | Target Velocity (m/s) |
|---|---|
| ... | ... |
| 101 | 10 |
| 102 | 20 |
| 103 | 20 |
| 104 | 10 |
| ... | ... |

The velocity over distance profile determined using any approach, e.g. such as one of the approaches described above, is used as an input to the model with time as an independent variable. The traction power to achieve a target velocity at specified power and distance is calculated 920. The dynamometer load equation is inverted 930 to calculate an actual velocity corresponding to the power delivered. The utility/disutility value is calculated 940 based on the actual velocity. The dynamometer load equation gives the instantaneous required power as a function of acceleration. Inverting the dynamometer load equation gives acceleration as a function of power. Given an available power, the inverted equation can be used to compute a maximum vehicle acceleration. Given a velocity at one time (sample), the velocity at a subsequent time (sample) can be calculated by assuming the acceleration is constant and equal to the maximum acceleration at the first sample time.

In some example embodiments, the model is based on an advanced control system as disclosed in Applicant's co-owned U.S. patent application Ser. No. 14/255,091 which is incorporated herein by reference in its entirety. In certain embodiments, the evaluation is based on a simple control system (such as maximally charging the energy storage element from the regenerative braking system and never from the engine). The control system itself can be varied as part of the design process. The output of the design circuitry is a set of design specifications based on some combination of utility/disutility values quantified by the model.

Some approaches for hybrid vehicle design circuitry described herein involve quantification of a utility/disutility variable associated with failing to complete drive cycle or route. For example, the quantification of the utility/disutility variable could involve extra time to complete drive cycle/route, percentage of routes for which vehicle fails to achieve desired acceleration/velocity, percentage of time or distance of drive cycle or route that the vehicle design fails to achieve desired acceleration/velocity. For drive cycles, some of these utility/disutility quantification approaches (e.g., extra time) require converting time-velocity drive cycle data to distance-velocity or distance-power data. This utility/disutility values could be combined with values for other utility/disutility variables in the vehicle design process. According to these approaches, the model operates to determine the value of the utility/disutility metric even through the drive cycle/route may not be completed, e.g., the vehicle design is unable to complete the drive cycle/route as commanded.

In some embodiments, the user can select and weight the utility/disutility values used to calculate the cost function. In some embodiments, an outer loop can be run that varies the sizes of the engine and energy storage element to quantify the utility/disutility values.

Figure 10:
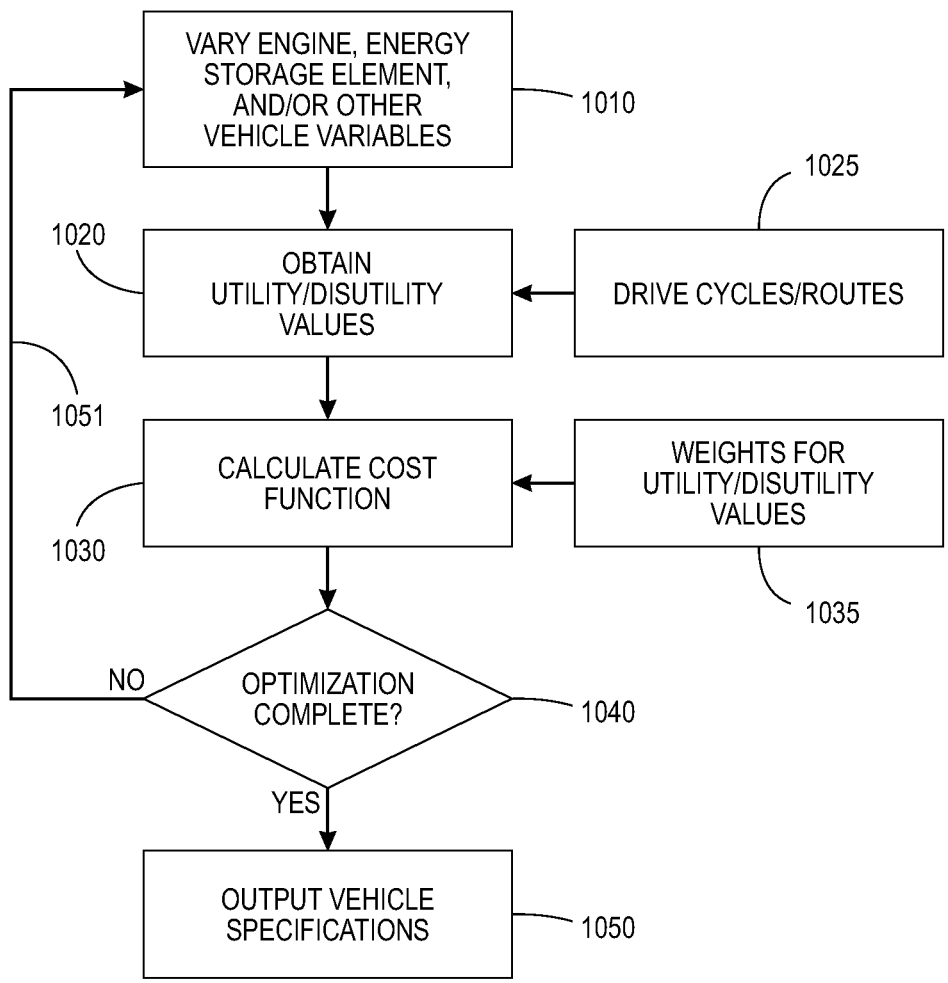
FIG. 10 is a flow diagram illustrating a hybrid vehicle design optimization process.

Some approaches involve design circuitry that can vary 1010 the engine performance itself (e.g. the engine map) as part of the outer loop optimization process, as illustrated by the flow diagram of FIG. 10. A set of drive cycles/routes are used 1025 that represent how the vehicle is going to be used. For example, if the design is optimized for city driving (or a particular city) drive cycles/routes representative of city driving or driving in the particular city are used. Utility/disutility values are determined 1020 based on the drive cycles/routes for the vehicle parameters. A cost function is calculated 1030 as previously discussed based on the utility/disutility values obtained. Optionally, weights for the utility/disutility values are entered 1035 and the cost function is calculated 1030 using the weighted utility/disutility values. The optimization process may continue along the outer loop 1051 by varying the vehicle variables again and repeating the inner loop 1020-1030. The process continues 1040 until the optimization is complete and the vehicle specifications are determined 1050.

According to some approaches, the model includes an energy storage element that is precharged, such as in a plug-in configuration. In some approaches, information about the drive cycles/routes can be entered; for example, a route may include terrain and/or traffic information, or statistical estimates thereof to evaluate the performance of the vehicle design over actual roads. In some embodiments, the design circuitry may provide a map of geographical regions over which the vehicle design is projected to meet a minimum level of performance. In some implementations, the design circuitry may a representative large set of real world drive cycles/routes and test the vehicle design against them some or all of the drive cycles/routes to determine what percentage of distance a driver would experience disutility. If real world speed/topography profiles are not available to predict power demand, then random routes generated from a map, with a simulated speed profile taking topography and road type into account could be used. The large set of random or real profiles could be varied according to test different topographies prevalent in the automobile's target market—e.g. mountainous region or flat city driving, and measure how much commonly drivers experience disutility in different situations. Design of the vehicle includes tuning of the energy storage element, e.g., flywheel and/or internal combustion engine size.

As discussed herein, design circuitry can be configured to design a high degree of hybridization vehicle based on simulation of a vehicle model and design, e.g., optimization, for given engine and/or energy storage sizes. The vehicle design may be/based on combinations of values for utility/disutility variables, such as the utility/disutility variables listed herein. Some approaches involve the use of a vehicle model based on a velocity-over-distance profile. Optionally, given a velocity-time profile (e.g., as used by standards bodies), a velocity-distance profile is computed. A time-step driven simulation is performed, tracking distance, looking up using the speed as a target speed from the speed distance profile to determine commanded acceleration in the simulator. This allows realistic velocity profile simulation (location based) where the vehicle cannot always meet the speeds demanded in the profile.

The hybrid vehicle design circuitry designed herein can be used to provide car-by-car design suitable for in-dealership design/customization of vehicles. Car-by-car design can provide vehicle designs that are based on specific driver needs and/or preferences (commuting fuel economy, cost, etc.) In some embodiments, the hybrid vehicle can include reconfigurable components, e.g., reconfigurable flywheel (radially actuated mass for changing power/energy) and/or tunable engine (with alternate cylinder heads for different power bands). Thus, the vehicle could be reconfigured for different uses e.g. weekday commute vs. holiday road trip vs. performance events). The reconfiguration could be for geographical relocation. The reconfigurable design could be designed for a particular locale, e.g. San Francisco, Phoenix and/or could be configured for a terrain/road type—e.g. hilly, flat, streets, highways and/or could be designed for an aggregate of driving routes. The aggregate of driving routes may include commutes in a particular location or in general, uploaded driver history (assuming this has been collected by previous vehicles/devices) and/or could be part of an in-dealership design.

Figure 11:
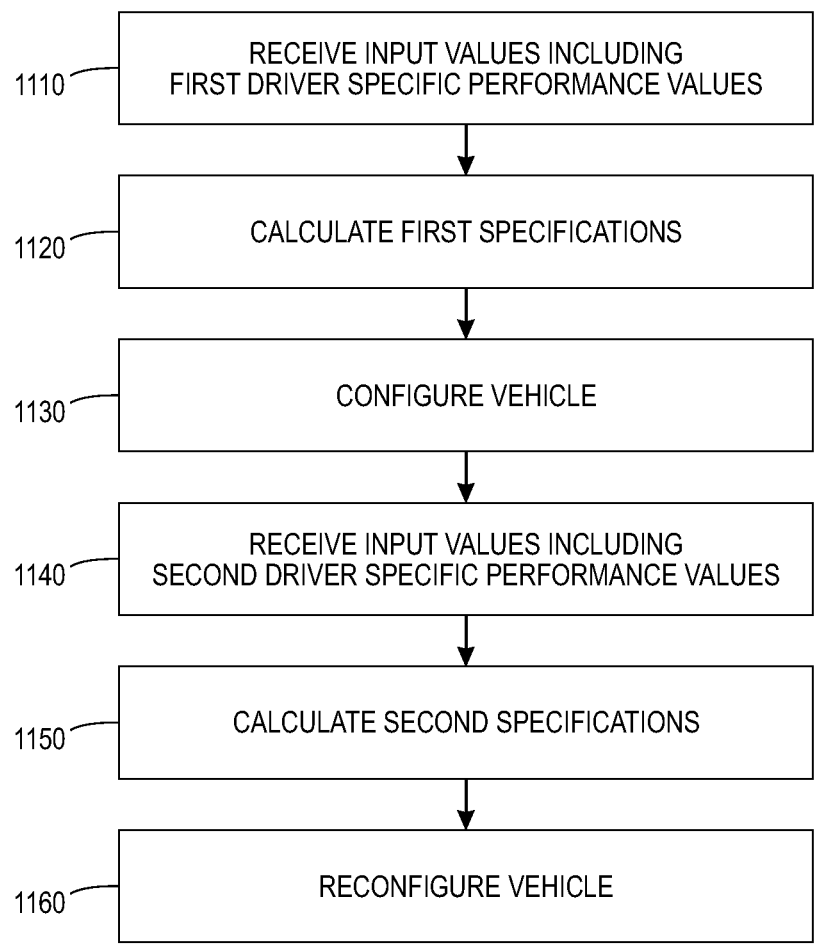
FIG. 11 depicts a process for reconfiguring a hybrid vehicle.

FIG. 11 is a flow diagram that illustrates reconfigurable vehicle design in accordance with some embodiments. At a first point in time, input values including first driver specific performance values are received 1110 by the design circuitry. A first set of specifications for the hybrid vehicle are calculated 1120, e.g., according to previous discussion in connection with quantified utility/disutility values. The vehicle is configured 1130 according to the first set of specifications.

At a second point in time, input values including second driver specific performance values are received 1140. A second set of specifications for the hybrid vehicle are calculated 1150. The vehicle is reconfigured 1160 according to the second set of specifications.

In some embodiments, the software (e.g., firmware) of the vehicle may be reconfigured. Software reconfiguration may be remote such that the reconfiguration software is downloaded to the vehicle controller from a remote location, e.g., the drive does not have to return to the dealership for reconfiguration. In some embodiments, the hardware of the vehicle may be reconfigured, e.g., by physically replacing and/or adjusting hardware components of the vehicle. In some embodiments, adjusting the hardware components may be achieved remotely. In some embodiments, masses located on the flywheel may be repositioned and/or cylinders in the engine can be enabled or disabled.

Figure 12:
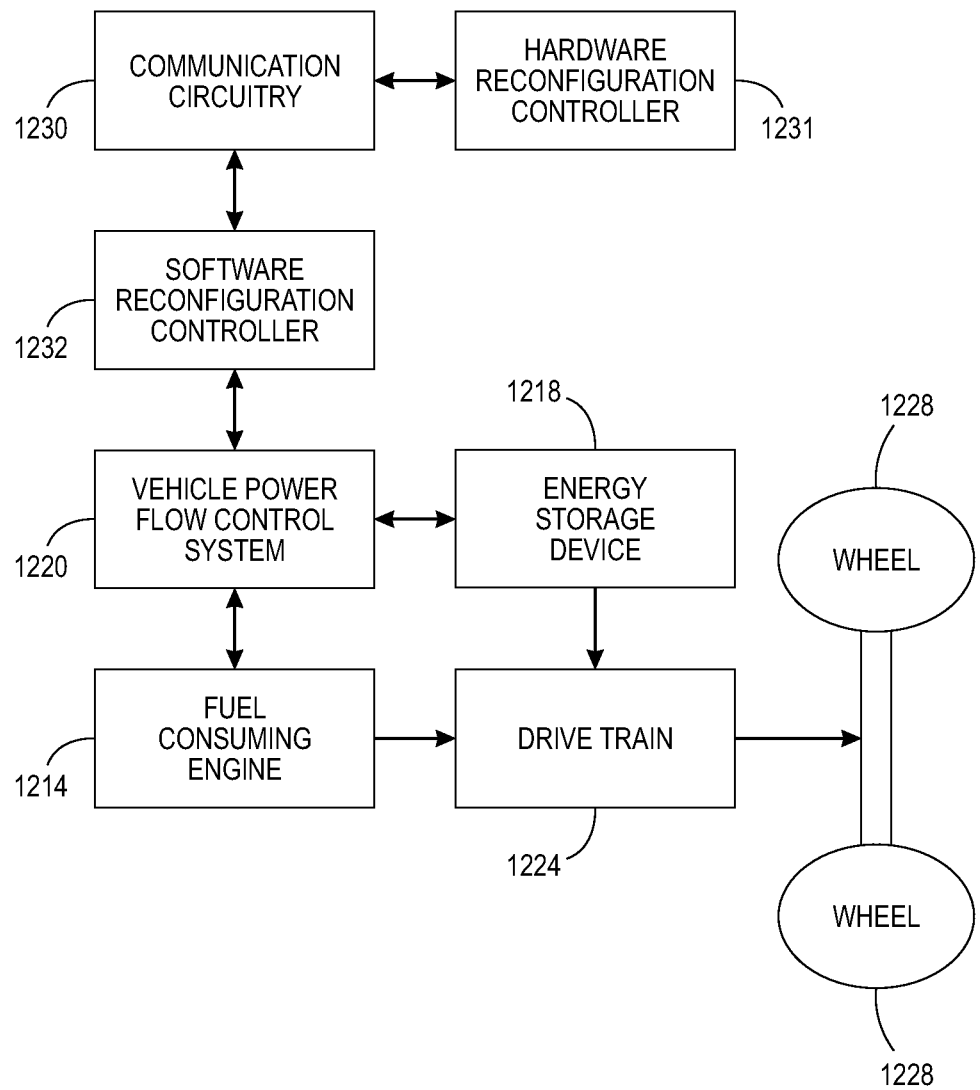
FIG. 12 is a block diagram of a reconfigurable hybrid vehicle.

FIG. 12 is a diagram of a hybrid vehicle that includes a fuel consuming engine 1214 and an energy storage device 1218 coupled to the hybrid vehicle drive train 1224 and wheels 1228,1228 to power to the hybrid vehicle. The power flowing from the engine 1214 and/or energy storage device 1218 are controlled by a vehicle power flow control system 1220. The hybrid vehicle optionally includes at least one of hardware and software that is reconfigurable at least in part automatically. For example, the reconfigurable hardware and/or software may be reconfigured according to a command received by communication circuitry 1230 of the hybrid vehicle and implemented by a hybrid vehicle hardware reconfiguration controller 1231 and/or a hybrid vehicle software reconfiguration controller 1232, wherein the communication circuitry 1130 and reconfiguration controllers 1231, 1232 are located in the hybrid vehicle. Communication circuitry 1230 can be configured to receive one or more reconfiguration instructions, e.g., the instructions can be transferred to the communication circuitry in-dealership over a wired communication link or from a remote location through a wireless communication link. The reconfiguration instruction includes a command portion and a data portion, wherein the command portion can indicate that a reconfiguration should occur and an indication of the hybrid vehicle component to be reconfigured. The data portion can provide specific value or value ranges for the components that are reconfigured.

Figure 13:
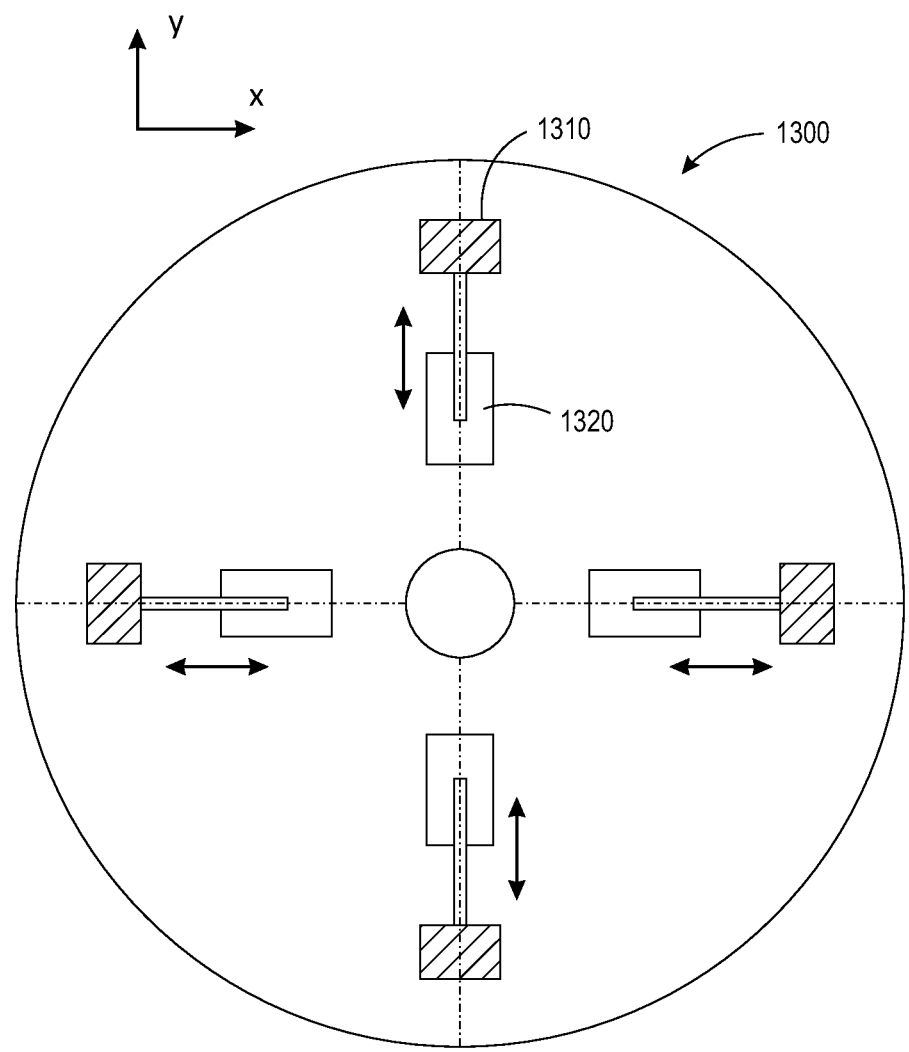
FIG. 13 illustrates a reconfigurable component of a hybrid vehicle.

FIG. 13 illustrates an example of automatic hardware reconfiguration in accordance with some embodiments. In this example, the hybrid vehicle includes a reconfigurable energy storage device, e.g., flywheel 1300 with repositionable masses 1310. The masses 1310 are repositionable along an x and/or y axes under by electronic control by linear actuators 1320. The linear actuators are responsive to a control signal provided by the hardware reconfiguration processor shown in FIG. 12. Reconfiguration of the flywheel 1300 can be implemented in response to a reconfiguration instruction having a command portion and a data portion, wherein the command portion of the instruction indicates the flywheel is to be reconfigured and the data portion indicates the radial position of the masses.

Items discussed in this disclosure include:

Item 1. A system comprising:
input circuitry configured to receive input values for one or more hybrid vehicle design variables;
hybrid vehicle design circuitry configured to quantify one or more values for one more utility/disutility variables of a hybrid vehicle design based on the input values by evaluating a hybrid vehicle model over a collection of at least one of drive cycles and routes (drive cycles/routes), the utility/disutility values including at least one of:
  total time or additional time beyond a reference time needed for the hybrid vehicle design to complete the drive cycles/routes,
  a fraction or number of the drive cycles/routes for which the hybrid vehicle design fails to achieve a target velocity, and
  amount of time or distance over which the hybrid vehicle design fails to achieve a target acceleration or the target velocity over the drive cycles/routes,
the hybrid vehicle design circuitry further configured to calculate one or more specifications of a hybrid vehicle design based on the utility/disutility values.

Item 2. The system of item 1, wherein the utility/disutility values include at least one of an engine consumption value and an engine output value.

Item 3 The system of item 2, wherein the engine consumption value includes a fuel consumption value and the engine output values includes a value related to environmentally harmful emissions.

Item 4. The system of any of items 1 through 3, wherein the utility/disutility values include at least one instantaneous performance value.

Item 5. The system of item 4, wherein the instantaneous performance value includes at least one of time to accelerate from a first predetermined velocity to a second predetermined velocity and maximum achievable velocity on a level road.

Item 6. The system of any of items 1 through 6, wherein the utility/disutility values include at least one trip-based performance value.

Item 7. The system of item 6, wherein the trip based performance value includes one or more of:
a portion of the drive cycles/routes that can be traversed at the target velocity;
the portion of the drive cycles/routes for which the hybrid vehicle design fails to achieve the target velocity;
a portion of the drive cycles/routes that the hybrid vehicle design can complete;
a portion of the drive cycles/routes that the hybrid vehicle design fails to complete;
the additional time needed for the hybrid vehicle design to complete the drive cycles/routes;
the amount of time or distance of the that the hybrid vehicle design fails to achieve the target velocity over the drive cycles/routes; and
time to complete each drive cycle/route.

Item 8. The system of claim 7, wherein:
the drive cycles include variations of standard U.S. Environmental Protection Agency (EPA) drive cycles; and
the variations include at least one of stochastic variations maintaining a total or average power and stochastic variations maintaining a power spectral density.

Item 9. The system of any of items 1 through 8, wherein the drive cycles/routes are selected depending on the utility/disutility variables being quantified.

Item 10. The system of any of item 1 through 9, wherein the drive cycles/routes include one or more of terrain and traffic information.

Item 11. The system of any of items 1 through 10, wherein the hybrid vehicle design circuitry is configured to calculate the specifications using a cost function and the utility/disutility values are numerical inputs to the cost function.

Item 12. The system of item 11, wherein the utility/disutility values are weighted with user-selected weighting coefficients.

Item 13. The system of any of claims 1 through 12, wherein;
the model operates with time as an independent variable and uses a velocity over distance profile as an input; and
the design circuitry is configured to calculate a traction power to achieve a target velocity at a particular distance and power delivered.

Item 14. The system of item 13, wherein if the traction power to achieve the target velocity is less than the power delivered, the design circuitry is configured to calculate an actual velocity corresponding to the power delivered.

Item 15. The system of item 14, wherein the design circuitry is configured to calculate the actual velocity by inverting a dynamometer load equation with acceleration linearized according to a simulation time step.

Item 16. The system of item 14, wherein the design circuitry is configured to calculate a traveled distance based on the actual velocity.

Item 17. The system of item 16, wherein the traveled distance is used with the velocity over distance profile to compute a target velocity.

Item 18. The system of any of items 13 through 17, wherein the design circuitry is configured to compute the velocity over distance profile from a velocity time profile.

Item 19. The system of item 18, wherein the design circuitry is configured to compute the velocity over distance profile from the velocity time profile using integration and resampling.

Item 20. The system of item 18, wherein the design circuitry is configured to compute the velocity over distance profile from the velocity time profile by running a time step simulation that uses each velocity of the velocity time profile as a target velocity for the velocity over distance profile and calculates a commanded acceleration.

Item 21. The system of any of claims 1 through 20, wherein the hybrid vehicle design circuitry is configured to determine optimal values for the hybrid vehicle design specifications based on the utility/disutility values.

Item 22. The system of item 21, wherein the optimal specifications include optimal acceleration.

Item 23. The system of item 21, wherein the optimal specifications include an amount of uniformity of driver experience.

Item 24. The system of any of items 1 through 23, wherein the model varies one or more vehicle specific values and calculates the hybrid vehicle specifications using the vehicle specific values.

Item 25. The system of item 24, wherein the one or more vehicle specific values that are varied include at least one of engine size and energy storage element size.

Item 26. The system of item 24, wherein the vehicle specific values that are varied includes a charge state of an energy storage element.

Item 27. The system of item 24, wherein the design circuitry is configured to vary one or more engine performance values and to calculate the hybrid vehicle specifications using the engine performance values.

Item 28. The system of any of items 1 through 27, wherein the design circuitry is configured to provide a map of geographical regions where a hybrid vehicle having the calculated hybrid vehicle design specifications is projected to meet a specified level of performance.

Item 29. The system of any of items 1 through 28, wherein the drive cycles/routes include real world routes that include speed and topography information.

Item 30. The system of any of items 1 through 28, wherein the drive cycles/routes include simulated speed profiles based on topography and road type.

Item 31. A system, comprising:
input circuitry configured to receive input values for one or more hybrid vehicle design variables;
hybrid vehicle design circuitry configured to quantify one or more values for one more utility/disutility variables of a hybrid vehicle design based on the input values by evaluating a hybrid vehicle model over a collection of at least one of drive cycles and routes (drive cycles/routes), the utility/disutility values including at least one of:
total time or additional time beyond a reference time needed for the hybrid vehicle design to complete the drive cycles/routes,
a fraction or number of the drive cycles/routes for which the hybrid vehicle design fails to achieve a target velocity, and
amount of time or distance over which the hybrid vehicle design fails to achieve a target acceleration or the target velocity over the drive cycles/routes,
the hybrid vehicle design circuitry configured to calculate one or more specifications of a hybrid vehicle design based on the utility/disutility values, wherein the design circuitry is configured to calculate the specifications that provide performance within a specified range for a particular geographic region.

Item 32. The system of item 31, wherein the model includes values for one or more of vehicle specific variables and one of more driver specific variables.

Item 33. The system of item 32, wherein at least one of the vehicle specific values and the driver specific values are weighted by a driver.

Item 34. The system of an of items 31 through 33, wherein the vehicle specific values include a value for at least one electrical or mechanical variable of the hybrid vehicle design.

Item 35. The system of any of items 31 through 34, wherein the specifications comprise specifications for one or more reconfigurable vehicle components.

Item 36. The system of item 35, wherein the reconfigurable vehicle components include an energy storage element, an engine, and a hybrid vehicle control system.

Item 37. A method of designing a hybrid vehicle, comprising:
receiving input values for one or more hybrid vehicle design variables;
quantifying one or more values for one more utility/disutility variables of a hybrid vehicle design based on the input values, the quantifying including evaluating a hybrid vehicle model over a collection of at least one of drive cycles and routes (drive cycles/routes), the utility/disutility values including at least one of:
- total time or additional time beyond a reference time needed for the hybrid vehicle design to complete the drive cycles/routes,
- a fraction or number of the drive cycles/routes for which the hybrid vehicle design fails to achieve a target velocity, and
- amount of time or distance over which the hybrid vehicle design fails to achieve a target acceleration or the target velocity over the drive cycles/routes, calculating one or more specifications of a hybrid vehicle design based on the utility/disutility values.

Item 38. The method of item 37, wherein the utility/disutility values include at least one value related to engine consumption and at least one value related to engine output.

Item 39. The method of item 38, wherein the engine consumption value includes a fuel consumption value and the engine output value includes an amount of environmentally harmful emissions.

Item 40. The method of item 37, wherein the utility/disutility value includes at least one value related to instantaneous performance of the hybrid vehicle design.

Item 41. The method of item 40, wherein the instantaneous performance value includes at least one of time to accelerate from a first predetermined velocity to a second predetermined velocity and maximum achievable velocity on a level road.

Item 42. The method of item 37, wherein the utility/disutility values include at least one trip-based performance variable.

Item 43. The method of item 42, wherein the trip based performance value includes one or more of:
- a portion of the drive cycles/routes that can be traversed at the target velocity;
- the portion of the drive cycles/routes for which the hybrid vehicle design fails to achieve the target velocity;
- a portion of the drive cycles/routes that the hybrid vehicle design can complete;
- a portion of the drive cycles/routes that the hybrid vehicle design fails to complete;
- the additional time needed for the hybrid vehicle design to complete the drive cycles/routes;
- the amount of time or distance of the that the hybrid vehicle design fails to achieve the target velocity over the drive cycles/routes; and
- a fastest time to complete the particular drive cycle/route.

Item 44. The method of item 43, wherein:
- the drive cycles include variations of standard EPA drive cycles; and
- the variations include stochastic variations that maintain a total or average power or power spectral density.

Item 45. The method of any of items 37 through 44, further comprising selecting the drive cycles/routes depending on the utility/disutility variables being quantified.

Item 46. The method of any of items 37 through 45, wherein the drive cycles/routes include one or more of terrain and traffic information.

Item 47. The method of any of items 37 through 46, wherein calculating the specifications comprises using a cost function wherein the utility/disutility values are numerical inputs to the cost function.

Item 48. The method of item 47, further comprising weighting the utility/disutility values with user-selected weighting coefficients.

Item 49. The method of any of items 37 through 48, wherein evaluating the model comprises:
- using time as an independent variable for the model;
- using a velocity over distance profile as an input for the model; and
- calculating a traction power to achieve a target velocity at a specified distance and power delivered.

Item 50. The method of item 49, further comprising calculating an actual velocity corresponding to the power delivered if the traction power to achieve the target velocity is less than the power delivered.

Item 51. The method of item 50, wherein calculating the actual velocity comprises inverting a dynamometer load equation with acceleration linearized according to a simulation time step.

Item 52. The method of item 50, further comprising calculating a traveled distance based on the actual velocity.

Item 53. The method of item 52, wherein the traveled distance is used with the velocity over distance profile to compute a target velocity.

Item 54. The method of item 49, further comprising computing the velocity over distance profile from a velocity time profile.

Item 55. The method of item 54, wherein computing the velocity over distance profile from the velocity time profile comprises computing the velocity over distance profile from the velocity time profile using integration and resampling.

Item 56. The method of item 54, wherein computing the velocity over distance profile from the velocity time profile comprises running a time step simulation that uses each velocity of the velocity time profile as a target velocity for the velocity over distance profile; and
calculating a commanded acceleration.

Item 57. The method of any of claims 37 through 56, wherein calculating the one or more specifications of a hybrid vehicle design comprises calculating optimal performance specifications for at least one of a geographic area.

Item 58. The method of any of claims 37 through 57, wherein calculating the one or more specifications of a hybrid vehicle design comprises calculating optimal performance specifications for at least one of a type of route.

Item 59. The method of any of claims 37 through 58, wherein calculating the one or more specifications of a hybrid vehicle design comprises calculating an amount of uniformity of driver experience.

Item 60. The method of any of items 37 through 59, wherein operating the model comprises:
- varying a value of at least one vehicle specific parameter; and
- evaluating the model using the vehicle specific parameter value.

Item 61. The method of item 60, wherein the vehicle specific parameter value includes at least one of engine size and energy storage element size.

Item 62. The method of item 60, wherein the vehicle specific parameter comprises engine performance.

Item 63. The method of claim 60, wherein the vehicle specific parameter includes a charge state of an energy storage element.

Item 64. The method of any of items 37 through 63, further comprising providing a map of geographical regions where a hybrid vehicle having the calculated design specifications is projected to meet a specified level of performance.

Item 65. The method of any of items 37 through 64, wherein the drive cycles/routes include real world routes that include speed and topography information.

Item 66. The method of any of items 37 through 65, wherein the drive cycles/routes include simulated speed profiles based on topography and road type.

Item 67. A method, comprising:
receiving, in an input unit, first input values for one or more hybrid vehicle design variables, the first input values including a first set driver-specific performance preferences;
calculating, using a processor, first specifications of a reconfigurable hybrid vehicle design based on the first set of driver performance preferences;
configuring a hybrid vehicle based on the specifications;
receiving, in an input unit, second input values for the one or hybrid vehicle design variables, the second input values including a second set of driver-specific performance preferences;
calculating, using a processor, second specifications of a reconfigurable hybrid vehicle design based on the second set of driver performance preferences;
reconfiguring the hybrid vehicle based on the second specifications.

Item 68. The method of item 67, wherein at least one of the first and second sets of driver-specific performance preferences are based on one or more of commuting fuel economy, geographic location, terrain type, aggregation of driving routes, driver history, vehicle use.

Item 69. The method of any of items 67 through 68, wherein the first specifications include a first flywheel configuration and the second specifications include a second flywheel configuration.

Item 70. The method of item 69, wherein the first flywheel specification includes a flywheel mass location at a first radial distance from a flywheel center and the second flywheel specification includes a flywheel mass location at a second radial distance from the flywheel center.

Item 71. The method of any of items 67 through 70, wherein the first specifications include a first configuration of engine cylinders and the second specifications include a second configuration of engine cylinders.

Item 72. The method of item 71, wherein the first configuration of engine cylinders provides a first engine output power and the second configuration of engine cylinders provides a second engine output power.

Item 73. The method of item 72, wherein in the first configuration a first subset of cylinders is enabled and in the second configuration a second subset of cylinders is enabled.

Item 74. The method of any of items 67 through 73, wherein reconfiguring comprises manually reconfiguring.

Item 75. The method of any of claims 67 through 74, wherein reconfiguring comprises electronically reconfiguring.

Item 76. The method of item 67, wherein reconfiguring comprises:
sending a signal that includes a command to reconfigure and reconfiguration values to the hybrid vehicle;
receiving the signal in the hybrid vehicle; and
reconfiguring the hybrid vehicle in response to the signal.

Item 77. The method of item 76, wherein sending the signal comprises wirelessly sending the signal from a location remote from the hybrid vehicle.

Item 78. A hybrid vehicle including at least one reconfigurable component, comprising:
a fuel consuming engine configured to supply power to drive the hybrid vehicle;
an energy storage device disposed within the hybrid vehicle, the energy storage device configured to supply power to drive the hybrid vehicle;
a controller configured to automatically control power flow from the engine and from the energy storage device so as to provide power to drive the hybrid vehicle;
communication circuitry configured to receive a signal that includes a command to reconfigure and reconfiguration values to the hybrid vehicle;
a reconfiguration controller to reconfigure the reconfigurable component in response to the signal.

Item 79. A hybrid vehicle, comprising:
a fuel consuming engine configured to supply power to drive the hybrid vehicle;
a flywheel configured to store kinetic energy disposed within the hybrid vehicle, the flywheel configured to supply power to drive the hybrid vehicle, the flywheel including one or more masses at locations that are adjustable along a radial axis of the flywheel;
a controller configured to automatically control power flow from the engine and from the flywheel so as to provide power to drive the hybrid vehicle.

Item 80. The hybrid vehicle of item 79, wherein the locations of the masses are manually adjustable.

Item 81. The hybrid vehicle of claim 80, wherein the locations of the masses are automatically adjustable.

The foregoing description of the example embodiments has been presented for the purposes of illustration and description. It is not intended to be exhaustive or to limit the invention to the precise form disclosed. Many modifications and variations are possible in light of the above teaching. Any or all features of the disclosed embodiments can be applied individually or in any combination are not meant to be limiting, but purely illustrative. It is intended that the scope of the invention be limited not with this detailed description, but rather determined by the claims appended hereto.

What is claimed is:

1. A system comprising:
input circuitry configured to receive input values for one or more hybrid vehicle design variables; and
hybrid vehicle design circuitry configured to quantify one or more values for one or more utility/disutility variables of a hybrid vehicle design based on the input values by evaluating a hybrid vehicle model over a collection of at least one of drive cycles and routes (drive cycles/routes), wherein the model operates with time as an independent variable and uses a velocity over distance profile as an input, the utility/disutility values including at least one of:
a total time or additional time beyond a reference time needed for the hybrid vehicle design to complete the drive cycles/routes,
a fraction or number of the cycles/routes for which the hybrid vehicle design fails to achieve a target velocity, and
an amount of time or distance over which the hybrid vehicle design fails to achieve a target acceleration or the target velocity over the cycles/routes,
the hybrid vehicle design circuitry further configured to calculate one or more specifications of a hybrid vehicle design based on the utility/disutility values, the one or more specifications comprising a traction power to achieve a target velocity at a particular distance and specified power delivered.

2. The system of claim 1, wherein the target velocity varies over the drive cycles/routes.

3. The system of claim 1, wherein evaluating the hybrid vehicle design includes comparing at least one of the utility/disutility values to a benchmark associated with a standard vehicle model.

4. The system of claim 1, wherein the specifications include properties of one or more of:
  a fuel-consuming engine;
  an energy storage device;
  a flywheel;
  a battery;
  an ultracapacitor;
  a transmission; and
  a power train.

5. The system of claim 1, wherein the utility/disutility values include at least one of an energy consumption value and an engine emission value.

6. The system of any of claim 1, wherein the utility/disutility values include at least one of an instantaneous performance value and a trip-based performance value.

7. The system of claim 6, wherein the trip based performance value includes one or more of:
  a portion of the drive cycles/routes that can be traversed at the target velocity;
  the portion of the drive cycles/routes for which the hybrid vehicle design fails to achieve the target velocity;
  a portion of the drive cycles/routes that the hybrid vehicle design can complete;
  a portion of the drive cycles/routes that the hybrid vehicle design fails to complete;
  the additional time needed for the hybrid vehicle design to complete the drive cycles/routes;
  the amount of time or distance that the hybrid vehicle design fails to achieve the target velocity over the drive cycles/routes; and
  time to complete each drive cycle/route.

8. The system of claim 1, wherein the drive cycles/routes include one or more of terrain and traffic information.

9. The system of claim 1, wherein the hybrid vehicle design circuitry is configured to calculate the specifications using a cost function and the utility/disutility values are numerical inputs to the cost function.

10. The system of claim 9, wherein the utility/disutility values are weighted with user-selected weighting coefficients.

11. The system of claim 1, wherein the specifications include an amount of uniformity of driver experience.

12. The system of claim 1, wherein the hybrid vehicle design circuitry is further configured to calculate an actual velocity corresponding to the power delivered if the traction power to achieve the target velocity is less than the power delivered.

13. The system of claim 12, wherein the hybrid vehicle design circuitry is configured to calculate the actual velocity by inverting a dynamometer load equation with acceleration linearized according to a simulation time step.

14. A system, comprising:
  input circuitry configured to receive input values for one or more hybrid vehicle design variables; and
  hybrid vehicle design circuitry configured to quantify one or more values for one or more utility/disutility variables of a hybrid vehicle design based on the input values by evaluating a hybrid vehicle model over a collection of at least one of drive cycles and routes (drive cycles/routes), wherein the model operates with time as an independent variable and uses a velocity over distance profile as an input, the utility/disutility values including at least one of:
    total time or additional time beyond a reference time needed for the hybrid vehicle design to complete the drive cycles/routes,
    a fraction or number of the drive cycles/routes for which the hybrid vehicle design fails to achieve a target velocity, and
    amount of time or distance over which the hybrid vehicle design fails to achieve a target acceleration or the target velocity over the drive cycles/routes,
  the hybrid vehicle design circuitry configured to calculate one or more specifications of a hybrid vehicle design based on the utility/disutility values, wherein the design circuitry is configured to calculate the specifications that provide performance within a specified range for a particular geographic region, the one or more specifications comprising a traction power to achieve a target velocity at a particular distance and specified power delivered.

15. The system of claim 14, wherein the model includes values for one or more of vehicle specific variables and one of more driver specific variables.

16. The system of claim 14, wherein the specifications comprise specifications for one or more reconfigurable vehicle components.

* * * * *